US009706687B1

(12) United States Patent
Frangioso, Jr. et al.

(10) Patent No.: US 9,706,687 B1
(45) Date of Patent: Jul. 11, 2017

(54) ELECTRONIC EQUIPMENT CHASSIS HAVING STORAGE DEVICES AND OTHER MODULES CONFIGURED FOR FRONT-ACCESS REMOVABILITY

(71) Applicant: EMC Corporation, Hopkinton, MA (US)

(72) Inventors: Ralph C. Frangioso, Jr., Falmouth, MA (US); Robert Wierzbicki, Worcester, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 470 days.

(21) Appl. No.: 14/319,396

(22) Filed: Jun. 30, 2014

(51) Int. Cl.
H05K 7/20 (2006.01)
H05K 13/00 (2006.01)

(52) U.S. Cl.
CPC ..... H05K 7/20736 (2013.01); H05K 7/20709 (2013.01); H05K 13/00 (2013.01)

(58) Field of Classification Search
CPC ........................ H05K 7/20736; H05K 7/20709
See application file for complete search history.

(56) References Cited

U.S. PATENT DOCUMENTS

| 6,234,591 | B1 | 5/2001 | Driscoll et al. |
| 6,801,428 | B2 | 10/2004 | Smith et al. |
| 6,819,560 | B2 * | 11/2004 | Konshak ................. G06F 1/184 |
| | | | 361/679.5 |
| 7,042,720 | B1 * | 5/2006 | Konshak ............... G06F 13/409 |
| | | | 361/679.33 |
| 7,187,547 | B1 | 3/2007 | French et al. |
| 7,486,526 | B1 | 2/2009 | Frangioso, Jr. et al. |
| 7,577,767 | B1 | 8/2009 | Robillard et al. |
| 8,374,731 | B1 | 2/2013 | Sullivan |
| 8,451,600 | B1 * | 5/2013 | Ross ................... H05K 7/20545 |
| | | | 165/80.3 |
| 8,462,495 | B1 | 6/2013 | Keefe et al. |
| 2003/0223196 | A1 * | 12/2003 | Smith ..................... G06F 1/181 |
| | | | 361/679.48 |
| 2006/0187634 | A1 | 8/2006 | Tanaka et al. |
| 2008/0192428 | A1 | 8/2008 | Clayton et al. |
| 2009/0067127 | A1 | 3/2009 | Katakura et al. |

(Continued)

FOREIGN PATENT DOCUMENTS

GB 2467819 A 8/2010

OTHER PUBLICATIONS

Super Micro Computer Inc., "Super SC417J Chassis Series User's Manual," Manual Revision 1.0a, Nov. 28, 2011, 104 pages.

(Continued)

Primary Examiner — Hoa C Nguyen
Assistant Examiner — Christopher L Augustin
(74) Attorney, Agent, or Firm — Ryan, Mason & Lewis, LLP

(57) ABSTRACT

An electronic equipment chassis in one embodiment comprises a housing having a front portion and a rear portion, first and second rows of cooling modules disposed at respective upper and lower levels of the front portion, and a plurality of storage devices arranged in the front portion between the first and second rows of cooling modules. At least a subset of the cooling modules and the storage devices are configured so as to be removable from the chassis through a vertical plane of the front portion of the housing.

20 Claims, 10 Drawing Sheets

(56) References Cited

U.S. PATENT DOCUMENTS

| | | |
|---|---|---|
| 2010/0033930 A1 | 2/2010 | Wada |
| 2010/0172087 A1 | 7/2010 | Jeffery et al. |
| 2011/0058334 A1* | 3/2011 | Takemoto .......... H05K 7/20172 |
| | | 361/695 |
| 2013/0105139 A1* | 5/2013 | Campbell .......... H05K 7/20709 |
| | | 165/300 |
| 2014/0002988 A1* | 1/2014 | Roesner .................... G06F 1/20 |
| | | 361/679.49 |
| 2014/0138069 A1* | 5/2014 | Hao ................... H05K 7/20554 |
| | | 165/121 |

OTHER PUBLICATIONS

Super Micro Computer Inc., "SuperChassis 418E16-R1K62B," http://www.supermicro.com/products/chassis/4U/418/SC418E16-R1K62.cfm, Apr. 23, 2014, 2 pages.

Super Micro Computer Inc., "SuperChassis 842TQ-665B," http://www.supermicro.com/products/chassis/4U/842/SC842TQ-665.cfm, Apr. 23, 2014, 2 pages.

\* cited by examiner

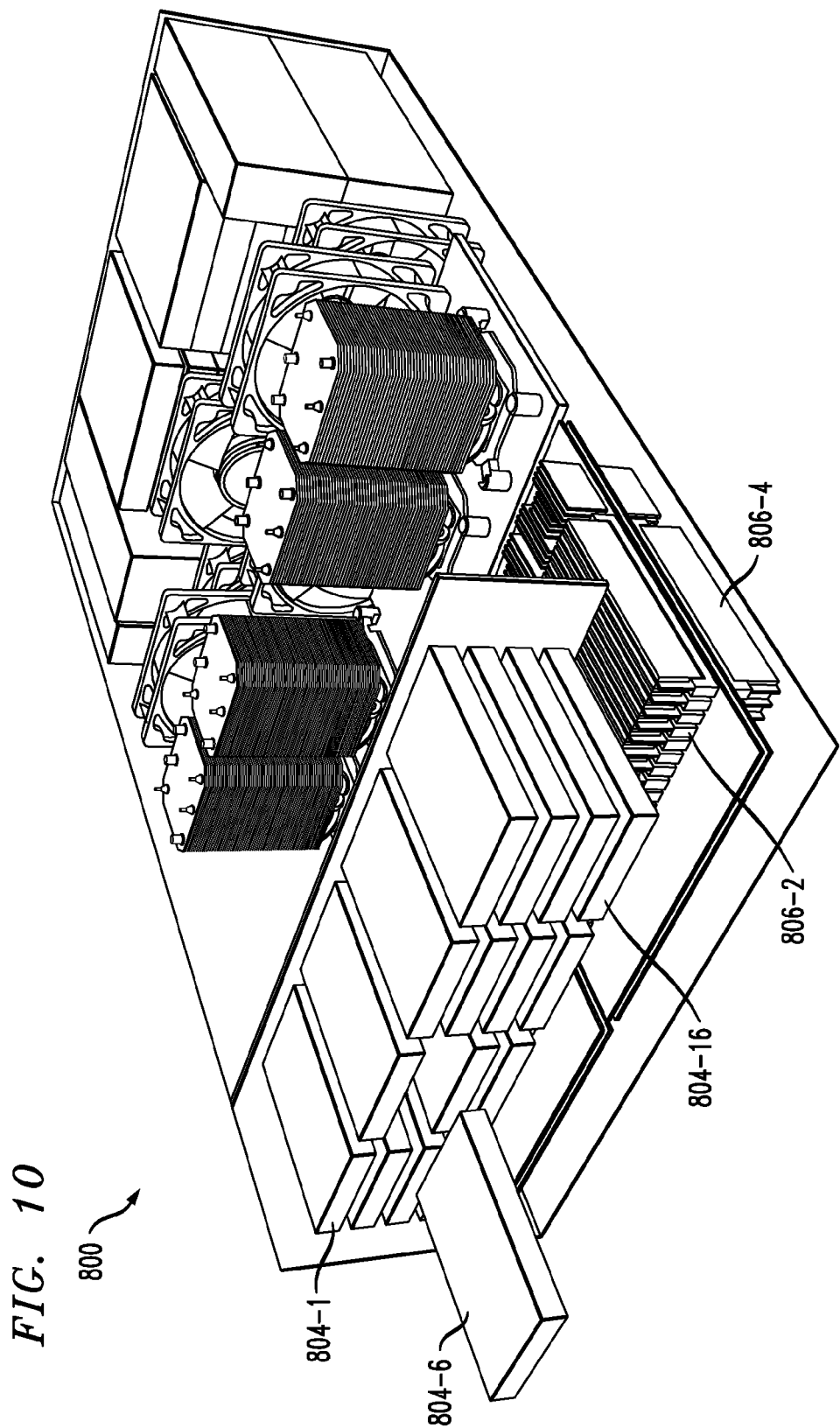

ELECTRONIC EQUIPMENT CHASSIS HAVING STORAGE DEVICES AND OTHER MODULES CONFIGURED FOR FRONT-ACCESS REMOVABILITY

FIELD

The field relates generally to electronic equipment, and more particularly to chassis configurations for such electronic equipment.

BACKGROUND

A given set of electronic equipment configured to provide desired system functionality is often installed in a chassis. Such equipment can include, for example, various arrangements of storage devices, memory modules, processors, circuit boards, interface cards and power supplies used to implement at least a portion of a storage system, a multi-blade server system or other type of information processing system.

The chassis typically complies with established standards of height, width and depth to facilitate mounting of the chassis in an equipment cabinet or other type of equipment rack. For example, standard chassis heights such as 1U, 2U, 3U, 4U and so on are commonly used, where U denotes a unit height of 1.75 inches (1.75") in accordance with the well-known EIA-310-D industry standard.

It is also common for a given chassis to include multiple internal cooling modules, such as fans or blower assemblies, particularly for certain chassis heights. For example, a typical 4U chassis will often include multiple fans arranged in the vicinity of a midplane of the chassis. Such an arrangement is problematic in that it requires top access to the chassis in order to service the fans, which can be highly susceptible to failure. Also, it may be necessary to provide cable management arms in order to facilitate removal of the fans from the midplane location of the chassis. Moreover, midplane placement of the fans can lead to additional chassis complexities, such as a requirement for inclusion of specialized midplane vent holes adjacent to storage devices in that area.

Accordingly, there is a need for an improved chassis configuration, particularly with regard to placement of modules such as cooling modules and dual in-line memory modules relative to storage devices.

SUMMARY

Illustrative embodiments of the present invention provide electronic equipment chassis configurations comprising storage devices and other modules configured for front-access removability.

In one embodiment, an electronic equipment chassis comprises a housing having a front portion and a rear portion, first and second rows of cooling modules disposed at respective upper and lower levels of the front portion, and a plurality of storage devices arranged in the front portion between the first and second rows of cooling modules. At least a subset of the cooling modules and the storage devices are configured so as to be removable from the chassis through a vertical plane of the front portion of the housing.

By way of example, an embodiment of this type illustratively comprises first and second rows of blower assemblies oriented to direct air in respective first and second lateral directions away from the storage devices and towards the rear portion of the housing, with each of the first and second rows comprising at least four blower assemblies.

Advantageously, such an arrangement avoids the need for top access to the chassis in order to service fans, blower assemblies or other types of cooling modules, while also eliminating the need for cable management arms and specialized midplane vent holes.

In another embodiment, an electronic equipment chassis comprises a housing having a front portion and a rear portion, at least one row of dual in-line memory modules disposed at one of an upper level and a lower level of the front portion, and a plurality of storage devices arranged in the front portion adjacent said at least one row of dual in-line memory modules. At least a subset of the dual in-line memory modules and the storage devices are configured so as to be removable from the chassis through a vertical plane of the front portion.

By way of example, an embodiment of this type illustratively comprises first and second rows of dual in-line memory modules with each such row comprising multiple groups of dual in-line memory modules. A given one of the groups more particularly comprises a plurality of dual in-line memory modules arranged in slots secured to a slidable tray configured to allow the given group to be removed from the chassis separately from the other groups through the vertical plane of the front portion.

Although such an embodiment may include conventional midplane fans and their associated drawbacks, it advantageously avoids the need for top access to the chassis in order to service the dual in-line memory modules. More particularly, memory repair in an electronic equipment chassis is considerably enhanced and simplified by providing functionality for hot replacement of such memory modules.

In some of the above-noted embodiments, the storage devices comprise respective hard disk drives, and the chassis has a 4U rack mount configuration.

Other embodiments include, without limitation, apparatus, systems and methods. For example, an exemplary apparatus or system in another embodiment of the invention illustratively comprises an electronic equipment rack having at least one electronic equipment chassis mounted therein.

BRIEF DESCRIPTION OF THE DRAWINGS

FIG. 10 is a perspective view of the FIG. 8 chassis with one of the storage devices removed.

DETAILED DESCRIPTION

Illustrative embodiments of the present invention will be described herein with reference to exemplary electronic equipment chassis arrangements that include storage devices and other modules configured for front-access removability. It is to be appreciated, however, that embodiments of the invention are not restricted to the particular illustrative chassis configurations shown. Accordingly, the term "electronic equipment chassis" as used herein is intended to be broadly construed, so as to encompass, for example, a wide variety of other arrangements of storage devices, cooling modules, dual in-line memory modules and other modules configured for front-access removability, arranged with other types of electrical equipment in a common housing of the chassis.

Figure 1:
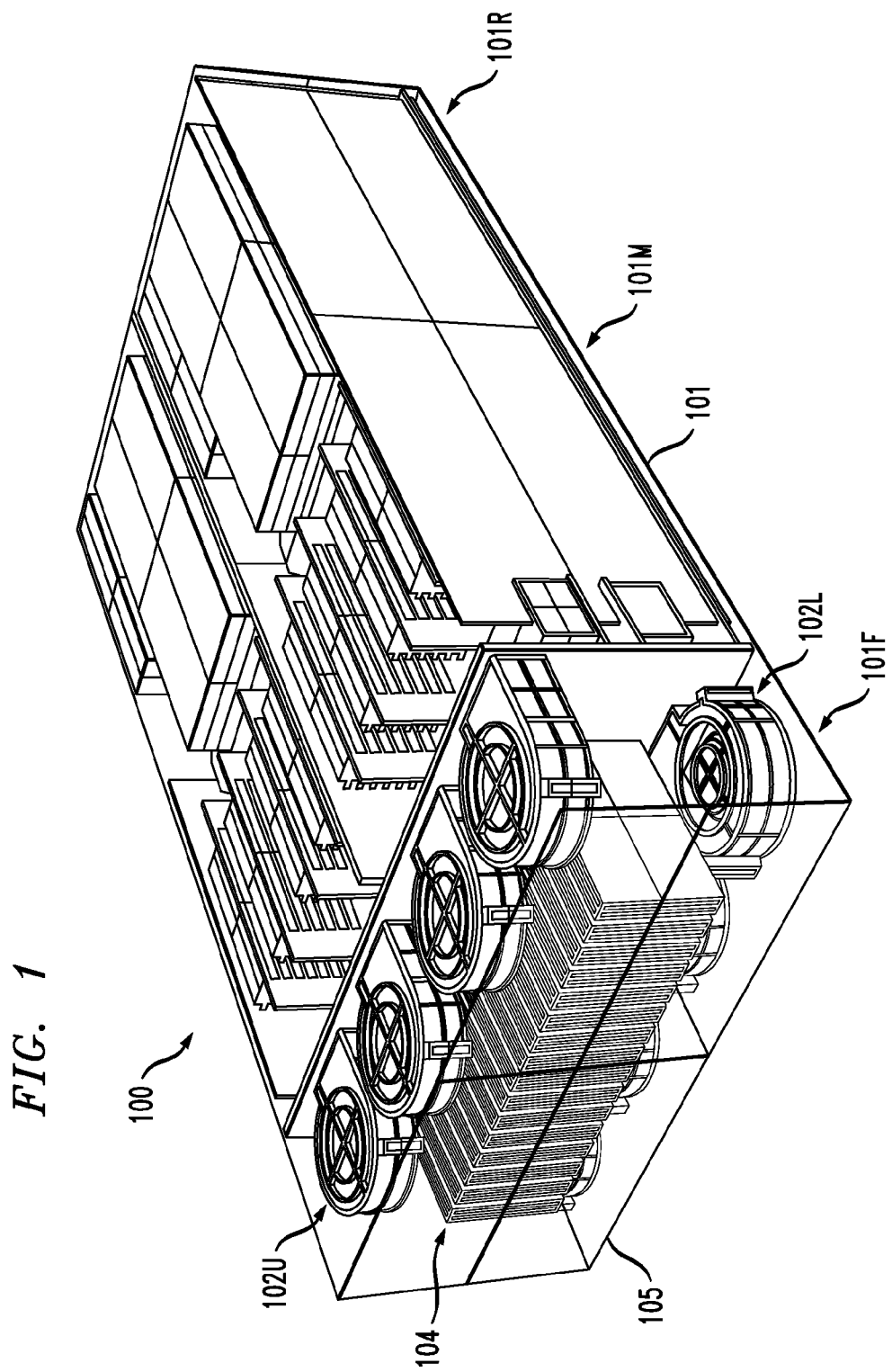
FIG. 1 is a perspective view of an electronic equipment chassis having multiple rows of blower assemblies and a plurality of storage devices all configured for front-access removability in a first illustrative embodiment of the invention.

FIG. 1 shows an electronic equipment chassis 100 in accordance with an illustrative embodiment of the present invention. The chassis 100 comprises a housing 101 having front portion 101F, rear portion 101R, and middle portion 101M between the front and rear portions 101F and 101R. First and second rows of blower assemblies 102U and 102L are arranged at respective upper and lower levels of the front portion 101F as shown. In addition, multiple storage devices 104 are arranged in the front portion 101F between the first and second rows of blower assemblies 102U and 102L. The blower assemblies are also collectively referred to herein using the reference numeral 102.

In this embodiment, each of the blower assemblies 102 in the first and second rows 102U and 102L is configured so as to be removable from the chassis 100 through a vertical plane 105 of the front portion 101F of the housing 101. Similarly, each of the storage devices 104 is configured so as to be removable from the chassis 100 through the vertical plane 105 of the front portion 101F of the housing 101. By way of example, each of the blower assemblies 102 and storage devices 104 can be configured as a hot-pluggable module so as to be removable from the chassis 100 through the vertical plane 105 of the front portion 101F. A "hot-pluggable module" as that term is used herein is intended to refer to a module that can be safely inserted in or removed from an electronic equipment chassis without turning off the chassis power. Similarly, "hot replacement" of a given module refers to removal of the given module and replacement of that module with another module while the chassis power remains turned on.

In some embodiments, the chassis 100 is configured with a front panel coincident with the vertical plane 105. Such a front panel includes one or more openings through which the blower assemblies 102 and the storage devices 104 can be removed. However, the chassis 100 need not include a front panel.

It should be noted that storage devices and other modules referred to herein as being configured for front-access removability are assumed to be similarly configured in a complementary manner for front-access insertability. Thus, it is assumed with reference to the FIG. 1 embodiment that each of the blower assemblies 102 and storage devices 104 can be both inserted in and removed from the chassis 100 through the vertical plane 105 of the front portion 101F of the housing 101.

The first and second rows of blower assemblies 102U and 102L are oriented to direct air in respective first and second lateral directions away from the storage devices 104 and towards the middle and rear portions 101M and 101R of the housing 101.

The blower assemblies 102 are examples of what are more generally referred to herein as "cooling modules." Other types of cooling modules, such as fans, can be used in other embodiments. In the present embodiment, each of the rows 102U and 102L comprises four distinct blower assemblies, although more or fewer blower assemblies could be used in each row in other embodiments. Also, more than two rows of blower assemblies, possibly with different numbers of blower assemblies in each row, could be utilized in other embodiments. Although not explicitly illustrated in the figure, control circuitry for controlling the blower assemblies is assumed to be incorporated into the chassis 100. By way of example, such control circuitry may be configured utilizing techniques such as those disclosed in U.S. Pat. No. 8,374,731, issued Feb. 12, 2013 and entitled "Cooling System," which is commonly assigned herewith and incorporated by reference herein.

The storage devices 104 are illustratively implemented as respective 2.5" hard disk drives (HDDs), although other types of storage devices can be used, including, for example, 3.5" hard disk drives.

The chassis 100 in the FIG. 1 embodiment has a 4U rack mount configuration, and thus a height equivalent to four standard units of 1.75" each for a total height of 7.0" although it is to be appreciated that other chassis dimensions could be used in other embodiments. As one example of an alternative chassis arrangement, a 5U rack mount configuration could be used in an embodiment in which 3.5" hard disk drives are used in place of 2.5" hard disk drives.

The 4U rack mount configuration utilized in the FIG. 1 embodiment is designed to facilitate mounting of the chassis 100 in an electronic equipment cabinet or other type of electronic equipment rack of standard dimensions. Such an electronic equipment rack can incorporate multiple instances of the chassis 100 or a single instance of chassis 100 in combination with one or more other chassis instances of different types, as required to meet the needs of a particular system.

Advantageously, the blower assemblies 102 and storage devices 104 are removable from the chassis 100 through the vertical plane 105 of the front portion 101F of the housing 101 while the chassis 100 is mounted in the rack. The need for top access to the chassis 100 in order to service the blower assemblies 102 is avoided, as are the complexities associated with the above-described conventional midplane arrangements of fans, such as cable management arms and specialized midplane vent holes.

The middle portion 101M of chassis housing 101 in the FIG. 1 embodiment illustratively comprises a plurality of dual in-line memory modules (DIMMs) arrayed on vertical trays that are substantially parallel to one another. Alternative embodiments comprising dual in-line memory modules configured for front-access removability will be described in more detail below with reference to FIGS. 6-10.

The rear portion 101R of chassis housing 101 in the FIG. 1 embodiment comprises additional electrical equipment such as processors, circuit boards, interface cards and power supplies. The particular type of modules and other electronic equipment implemented within the middle portion 101M and rear portion 101R, and their manner of interconnection, will vary depending upon the particular needs of the system in which the chassis will be deployed, and the invention is not limited in this regard.

Moreover, the particular configuration of front-access blower assemblies 102 and storage devices 104 can also be varied to suit the needs of a particular system implementation.

In one possible implementation, the chassis 100 is configured to support four Intel EX processors and 96 DIMMs arranged on 8 memory risers, with between 4 and 16 hot-pluggable 2.5" HDDs, as well as associated circuit boards including Redundant Array of Independent Disk (RAID) or RAID-on-chip (ROC) cards, Peripheral Component Interconnect (PCI) mezzanine cards, and PCI express (PCIe) interface cards. The latter interface cards can provide, for example, 2× Full-Height Full-Length (FHFL)×16 lane slots and 2×FHFL×8 lane slots, with possible upgrade to support ten PCIe Gen3 slots arranged in 2×16 and 8×8 configurations. Support for other equipment, such as one or more network switches, can be provided. Also, associated power supplies, heat sinks, interconnects and other related equipment as needed in a given implementation are assumed to be included. Again, these are only examples, and numerous alternative equipment configurations are possible.

In an exemplary method embodiment, the chassis 100 is configured to include the first and second rows of blower assemblies 102U and 102L disposed at respective upper and lower levels of a front portion of a housing of the chassis, and the chassis is also configured to include the plurality of storage devices 104 arranged in the front portion 101F of the housing 101 between the first and second rows of blower assemblies 102U and 102L. The method further includes removing at least a subset of the blower assemblies 102 and the storage devices 104 from the chassis 100 through the vertical plane 105 of the front portion 101F of the housing 101. Other possible method steps include, for example, complementary insertion of at least a subset of the blower assemblies 102 and the storage devices 104 into the chassis 100 through the vertical plane 105 of the front portion 101F of the housing 101. Also, mounting the chassis 100 in an electronic equipment rack, as noted above, with the insertion and removal of blower assemblies 102 and storage devices 104 occurring while the chassis 100 is mounted in the rack.

Figure 2:
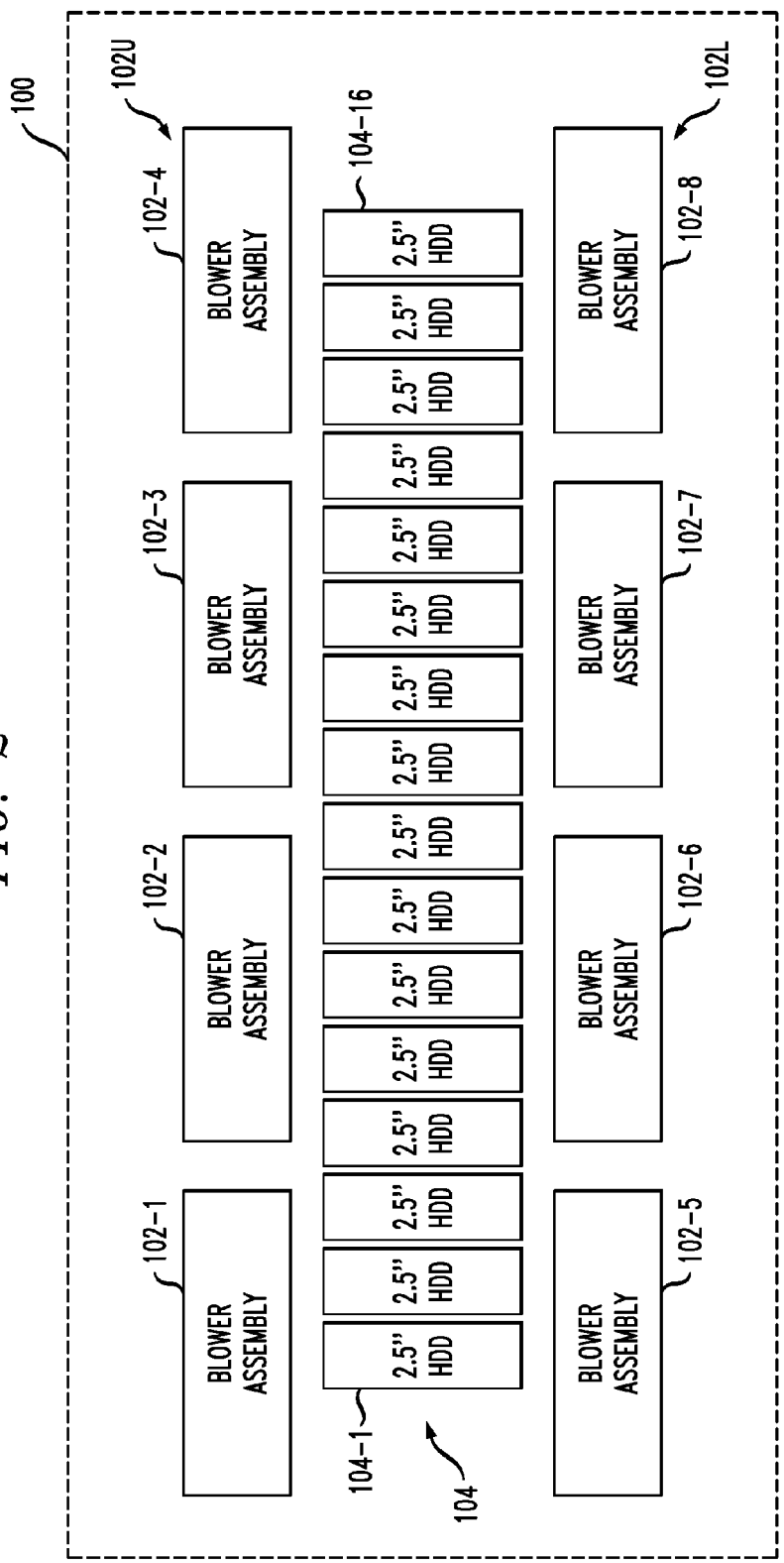
FIG. 2 is a frontal view of a portion of the FIG. 1 chassis.

Referring now to FIG. 2, a frontal view of the chassis 100 is shown. It can be seen in this view that the first and second rows 102U and 102L of blower assemblies more particularly comprise upper blower assemblies 102-1, 102-2, 102-3 and 102-4 and lower blower assemblies 102-5, 102-6, 102-7 and 102-8. These blower assemblies 102 are arranged on either side of a set of 16 2.5" HDDs 104, more particularly denoted in the figure as HDDs 104-1 through 104-16. The HDDs are vertically oriented and arranged in parallel with one another, between the first and second rows 102U and 102L of blower assemblies.

Figure 3:
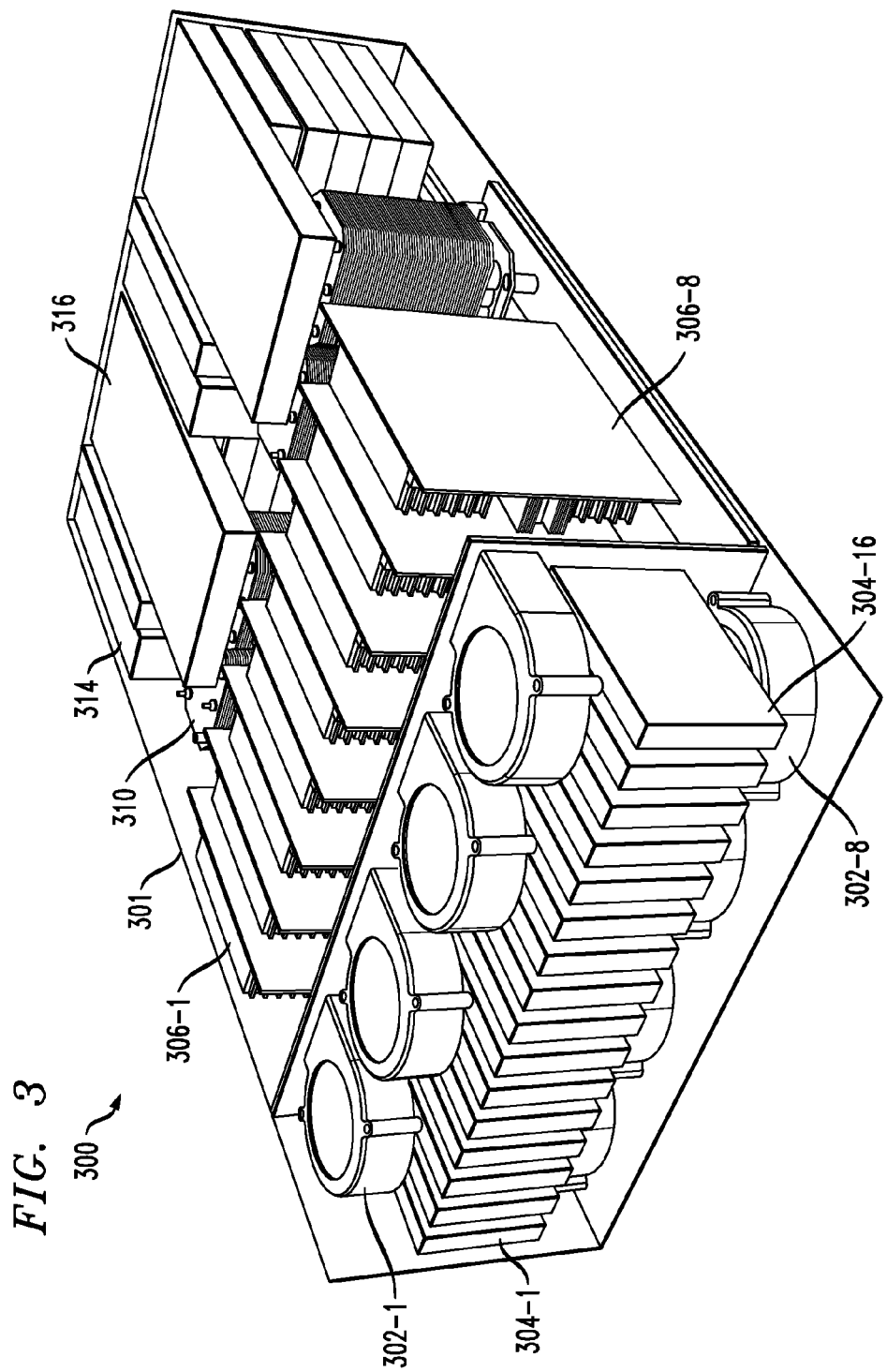
FIG. 3 is a perspective view of an electronic equipment chassis having multiple rows of blower assemblies and a plurality of storage devices all configured for front-access removability in a second illustrative embodiment of the invention.

FIG. 3 shows an electronic equipment chassis 300 in another illustrative embodiment. Like the chassis 100, the chassis 300 comprises a housing 301 with front, middle and rear portions. The front portion of the housing 301 includes multiple rows of blower assemblies 302 and a plurality of storage devices 304 all configured for front-access removability. Also, as in the chassis 100, the storage devices 304 in the chassis 300 are oriented vertically and in parallel with one another. The blower assemblies 302 in the chassis 300 are more particularly denoted as blower assemblies 302-1 through 302-8. It should be understood that a wide variety of different blower assembly arrangements may be used. For example, in some embodiments, each blower assembly of the type shown in FIGS. 1 and 3 may include an additional exterior housing that encloses a substantial portion of that blower assembly. The storage devices 304 in the chassis 300 are more particularly denoted as storage devices 304-1 through 304-16. Again, numerous other storage device arrangements may be used.

The middle portion of the chassis housing 301 includes a plurality of dual in-line memory modules 306 arranged in the form of eight vertically-oriented memory risers denoted 306-1 through 306-8. Each of the risers includes one or more small heat sinks.

The rear portion of the chassis housing 301 includes four larger heat sinks 310, as well as additional electrical equipment such as power supplies 314 and interface cards 316.

Figure 4:
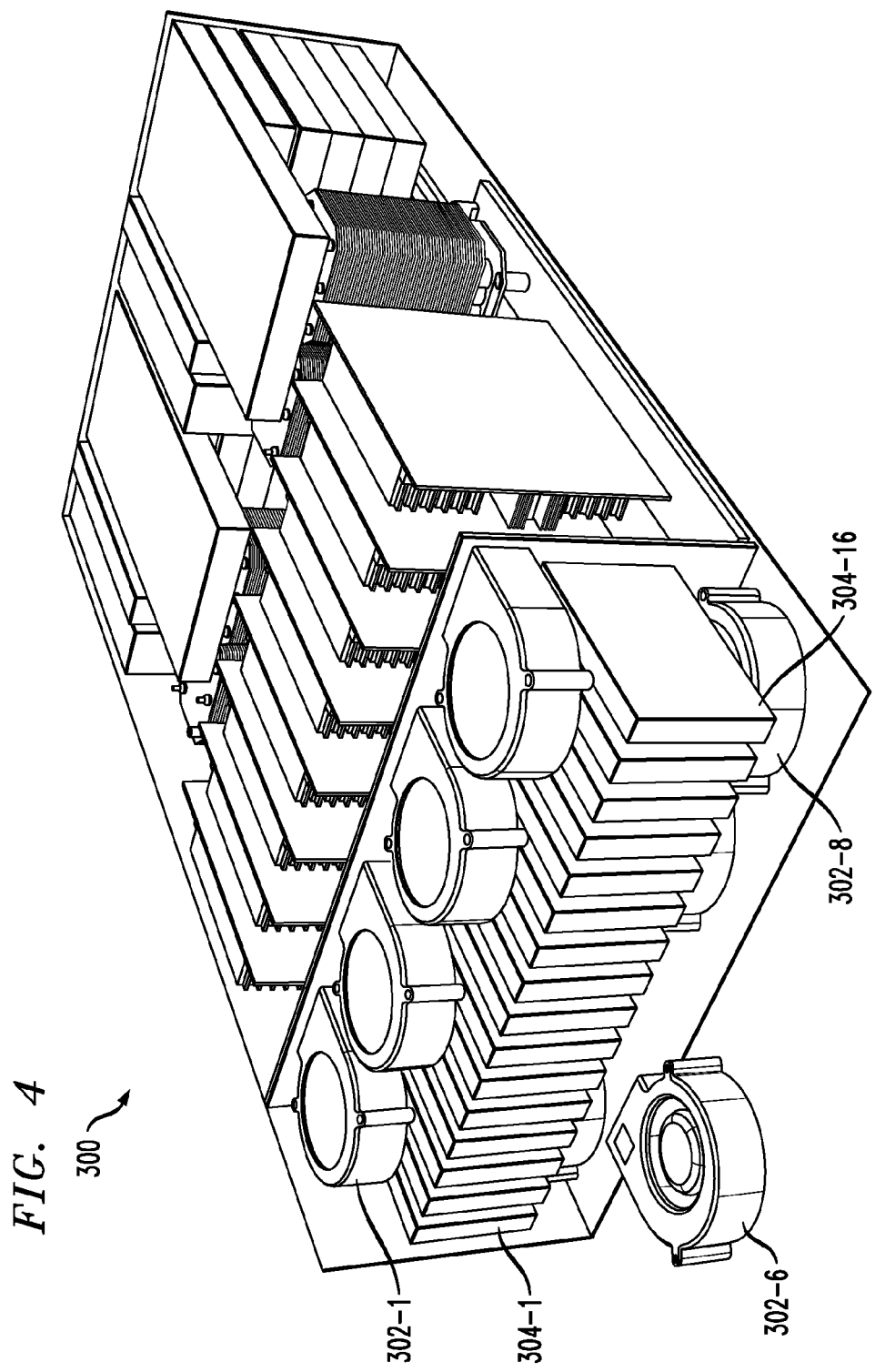
FIG. 4 is a perspective view of the FIG. 3 chassis with one of the blower assemblies removed.

FIG. 4 illustrates the removal of a particular one of the blower assemblies 302-6 from the chassis 300. Each of the seven other blower assemblies 302 is assumed to be similarly removable through a vertical plane of the front portion of the chassis housing 301.

Figure 5:
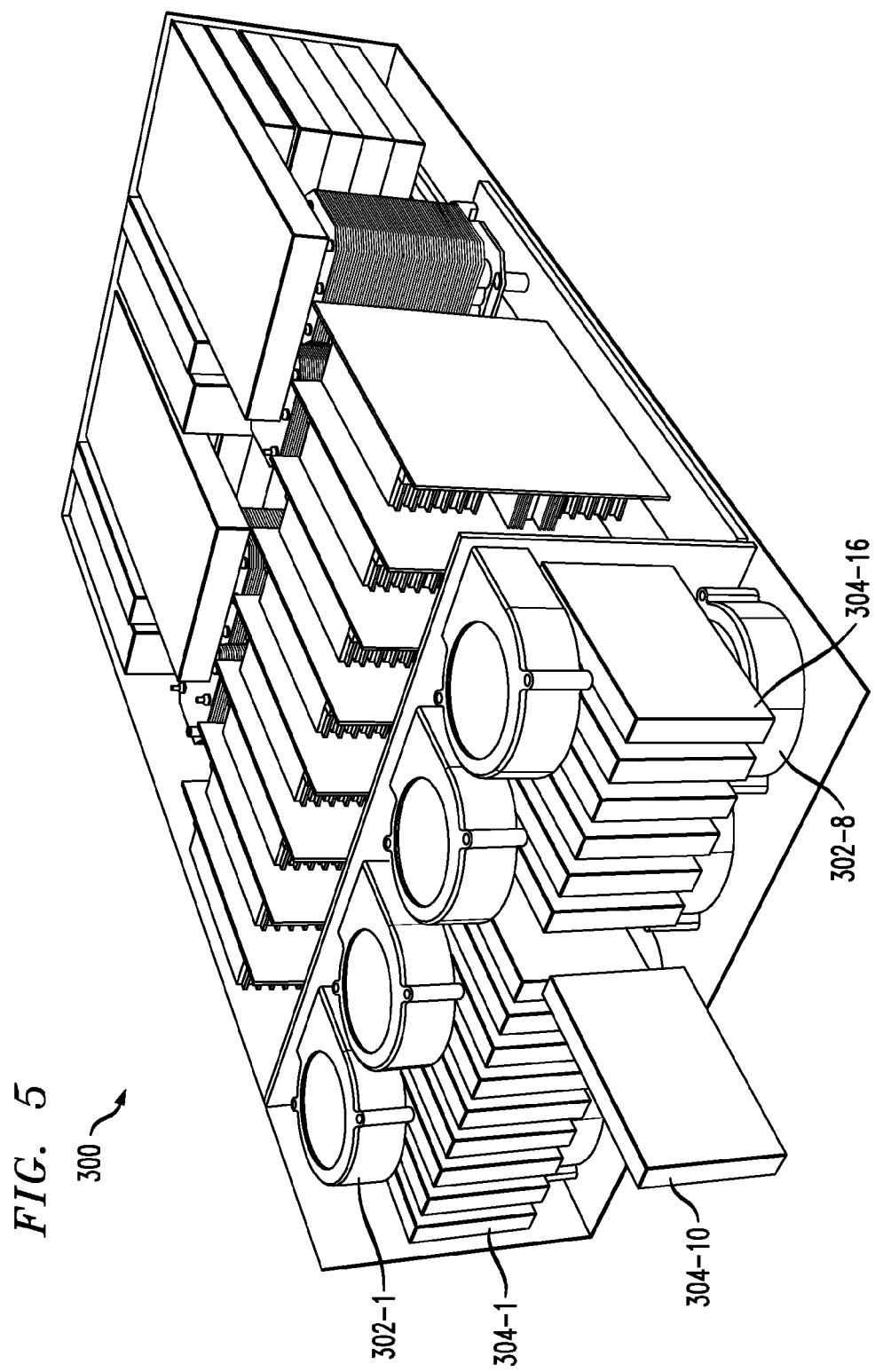
FIG. 5 is a perspective view of the FIG. 3 chassis with one of the storage devices removed.

FIG. 5 illustrates the removal of a particular one of the storage devices 304-10 from the chassis 300. Each of the 15 other storage devices 304 is assumed to be similarly removable through a vertical plane of the front portion of the chassis housing 301. The storage devices 304, like the storage devices 104 of the FIG. 1 embodiment, are implemented as respective 2.5" HDDs.

Embodiments of the invention configured for front-access removability of dual in-line memory modules and storage devices will now be described with reference to FIGS. 6-10.

Figure 6:
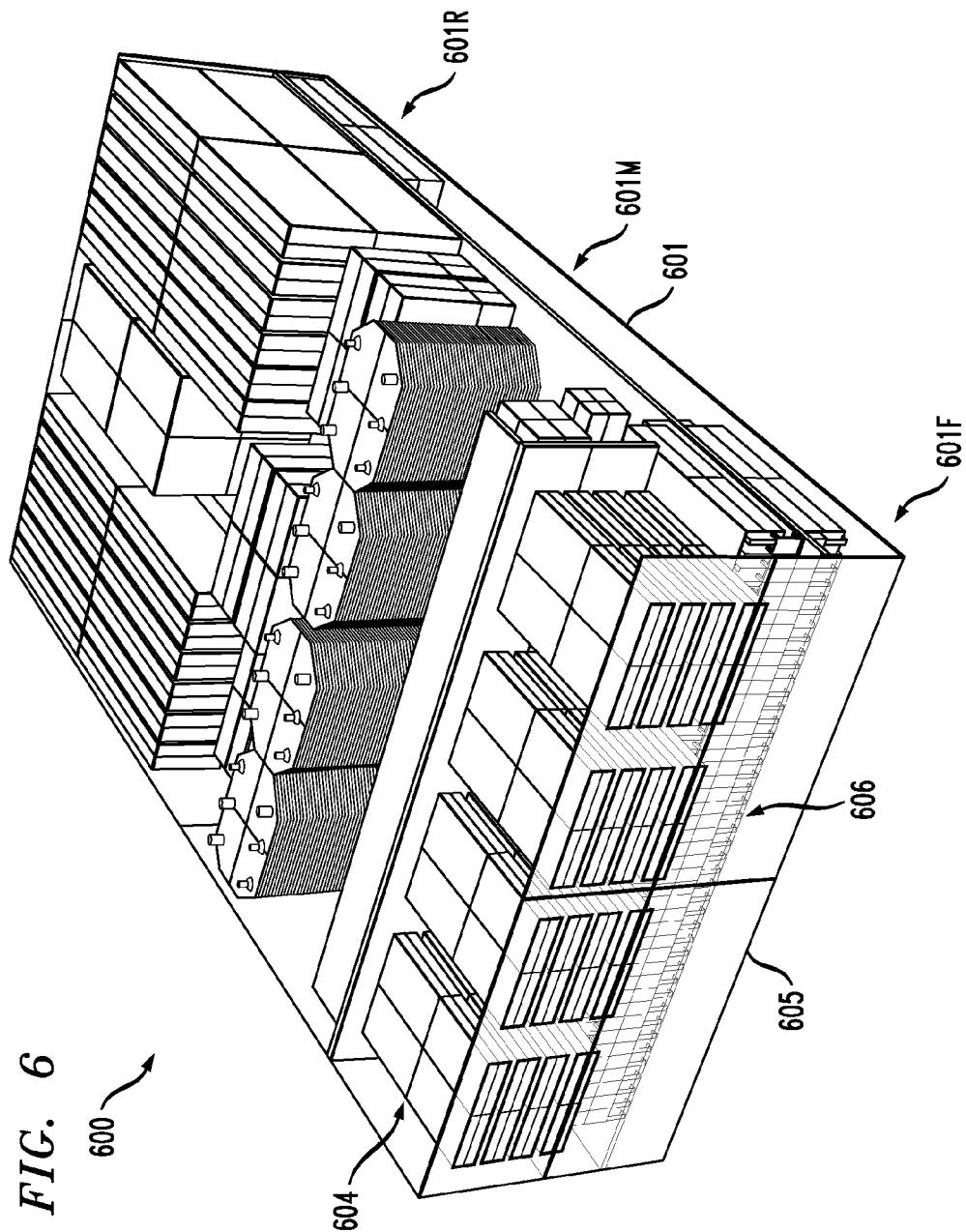
FIG. 6 is a perspective view of an electronic equipment chassis having multiple groups of dual in-line memory modules and a plurality of storage devices all configured for front-access removability in a third illustrative embodiment of the invention.

Referring initially to FIG. 6, an electronic equipment chassis 600 in accordance with an illustrative embodiment is shown. The chassis 600 comprises a housing 601 having front portion 601F, rear portion 601R, and middle portion 601M between the front and rear portions 601F and 601R. The modules configured for front-access removability in this embodiment comprise storage devices 604 and dual in-line memory modules 606. More particularly, first and second rows of dual in-line memory modules 606 are arranged in a lower level of the front portion 601F as shown, with each such row comprising multiple groups of dual in-line memory modules. In addition, multiple storage devices 604 are arranged in the front portion 601F above the first and second rows of dual in-line memory modules 606.

Figure 9:
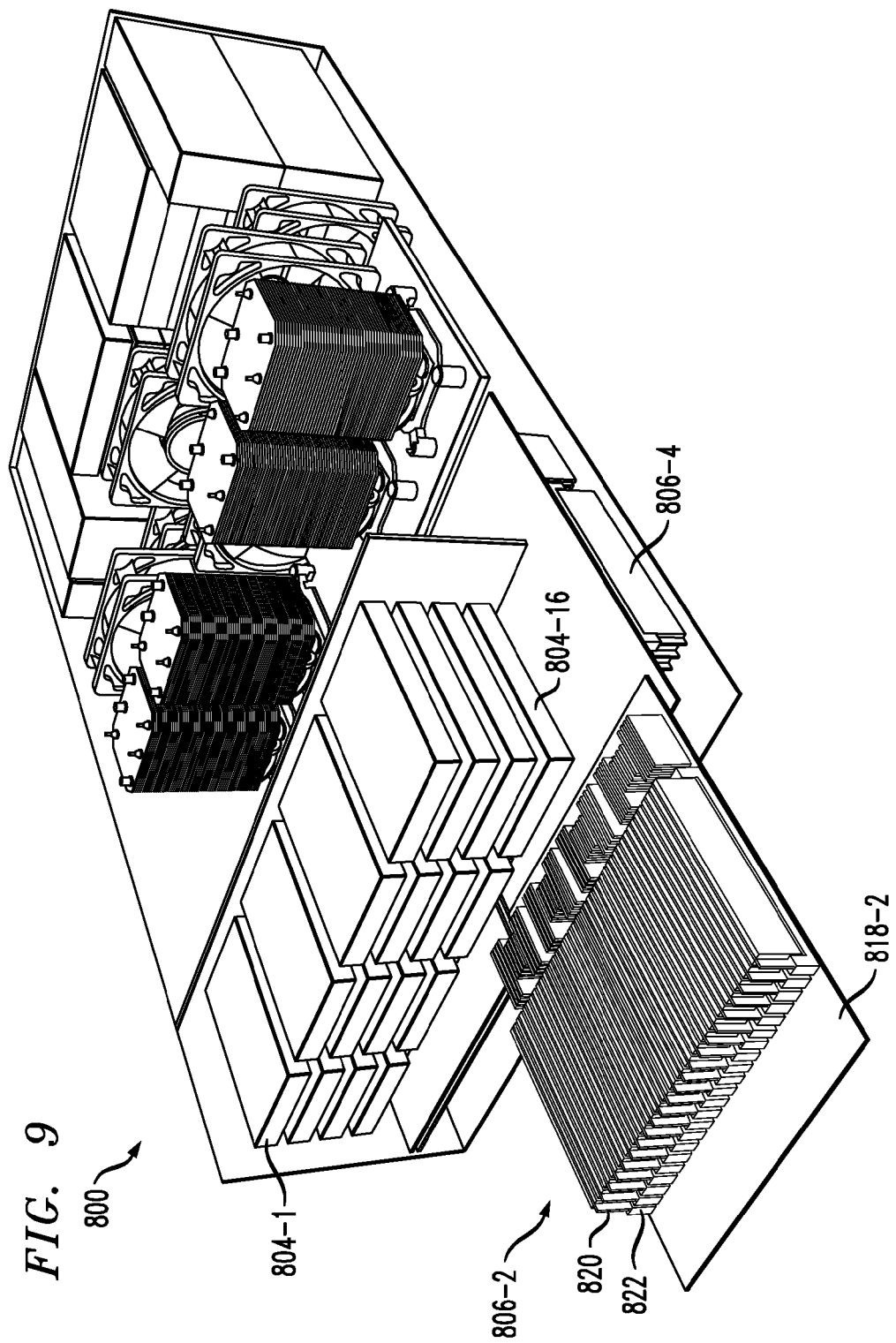
FIG. 9 is a perspective view of the FIG. 8 chassis with one of the groups of dual in-line memory modules removed.

In this embodiment, each of the groups of dual in-line memory modules 606 is configured so as to be removable from the chassis 600 through a vertical plane 605 of the front portion 601F of the housing 601. More particularly, the groups of dual in-line memory modules 606 are arranged on respective slidable trays so as be removable from the chassis 600 through the vertical plane 605 of the front portion 601F. Each of the groups comprises a plurality of dual in-line memory modules arranged in multiple slots secured to a slidable tray. The slidable tray is configured to allow the given group to be removed from the chassis 600 separately from the other groups through the vertical plane 605 of the front portion 601F. An illustration of such removability in a related embodiment is shown in FIG. 9.

Each of the rows of dual in-line memory modules 606 comprises two distinct groups of in-line memory modules, although different arrangements of rows and groups can be used in other embodiments. For example, a single row of one or more groups of dual in-line memory modules may be used, or more than two rows of such groups. Also, different ones of the rows can include different numbers of groups of dual in-line memory modules. In addition, it is possible to have one or more rows above the storage devices 604 as well as one or more rows below the storage devices 604, or only one or more rows above the storage devices 604 instead of below the storage devices 604 as is illustrated in the figure. Such arrangements are considered examples of rows being arranged "adjacent" the storage devices.

The storage devices 604 in this embodiment are illustratively shown as being oriented horizontally, rather than vertically as in the embodiments of FIGS. 1-5. However, it is also possible to orient the storage devices 604 vertically in an alternative configuration of the FIG. 6 embodiment.

Each of the storage devices 604 is also configured so as to be removable from the chassis 600 through the vertical plane 605 of the front portion 601F of the housing 601 in a manner similar to that previously described in conjunction with the embodiments of FIGS. 1-5. By way of example, each of the storage devices 604, like the storage devices 204 and 304, can be configured as a hot-pluggable module, so as to be removable from the chassis 600 through the vertical plane 605 of the front portion 601F. As in the previous embodiments, the storage devices 604 in the FIG. 6 embodiment are illustratively implemented as respective 2.5" HDDs, although other types of storage devices can be used.

The chassis 600 may be configured with a front panel coincident with the vertical plane 605. Such a front panel includes one or more openings through which the storage devices 604 and dual in-line memory modules 606 can be removed. However, the chassis 600 need not include a front panel.

Again, it should be understood that storage devices and other modules referred to herein as being configured for front-access removability are assumed to be similarly configured in a complementary manner for front-access insertability. Thus, it is assumed with reference to the FIG. 6 embodiment that each of the storage devices 604 and dual in-line memory modules 606 can be both inserted in and removed from the chassis 600 through the vertical plane 605 of the front portion 601F of the housing 601.

The chassis 600 includes midplane cooling modules in the form of a set of fans arranged adjacent to large heat sinks in the middle portion 601M of the housing 601. This exemplary arrangement of cooling modules is used instead of the front-access removable blower assemblies of FIGS. 1-5.

The chassis 600 also has a 4U rack mount configuration, and thus a height equivalent to four standard units of 1.75" each for a total height of 7.0" although it is to be appreciated that other chassis dimensions could be used in other embodiments. The 4U rack mount configuration is designed to facilitate mounting of the chassis 600 in an electronic equipment cabinet or other type of electronic equipment rack of standard dimensions. Such an electronic equipment rack can incorporate multiple instances of the chassis 600 or a single instance of chassis 600 in combination with one or more other chassis instances of different types, as required to meet the needs of a particular system.

Advantageously, the storage devices 604 and dual in-line memory modules 606 are removable from the chassis 600 through the vertical plane 605 of the front portion 601F of the housing 601 while the chassis 600 is mounted in the rack. Accordingly, the need for top access to the chassis 600 in order to service the storage devices 604 and dual in-line memory modules 606 is avoided. Arrangements of this type considerably enhance and simplify memory repair by facilitating hot replacement of memory modules. Moreover, such arrangements facilitate the addition of memory to a given chassis configuration, thereby permitting significant improvements in system performance and capabilities.

The rear portion 601R of the chassis housing 601 in the FIG. 6 embodiment comprises additional electrical equipment such as processors, circuit boards, interface cards and power supplies. The particular type of modules and other electronic equipment implemented within the middle portion 601M and rear portion 601R, and their manner of interconnection, will vary depending upon the particular needs of the system in which the chassis will be deployed, and the invention is not limited in this regard.

Moreover, the particular configuration of storage devices 604 and dual in-line memory modules 606 can also be varied to suit the needs of a particular system implementation.

In one possible implementation, the chassis 600 is configured to support similar equipment to that described above in the context of chassis 100. Such equipment illustratively comprises processors, RAID or ROC cards, PCI mezzanine cards, PCI interface cards and switches, and associated power supplies, heat sinks, interconnects and other related equipment, as well as additional or alternative equipment.

In an exemplary method embodiment, the chassis 600 is configured to include the first and second rows of dual in-line memory modules 606 arranged in a lower level of the front portion 601F, and the chassis is also configured to include the plurality of storage devices 604 arranged in the front portion 601F above the first and second rows of dual in-line memory modules 606. The method further includes removing at least a subset of the storage devices 604 and the dual in-line memory modules 606 from the chassis 600 through the vertical plane 605 of the front portion 601F of the housing. Other possible method steps include, for example, complementary insertion of at least a subset of the storage devices 604 and the dual in-line memory modules 606 into the chassis 600 through the vertical plane 605 of the front portion 601F of the housing 601. Also, mounting the chassis 600 in an electronic equipment rack, as noted above, with the insertion and removal of storage devices 604 and dual in-line memory modules 606 occurring while the chassis 600 is mounted in the rack. The removing step may more particularly comprise utilizing the slidable tray associated with a given one of the groups to remove that group separately from the other groups through the vertical plane of the front portion.

Figure 7:
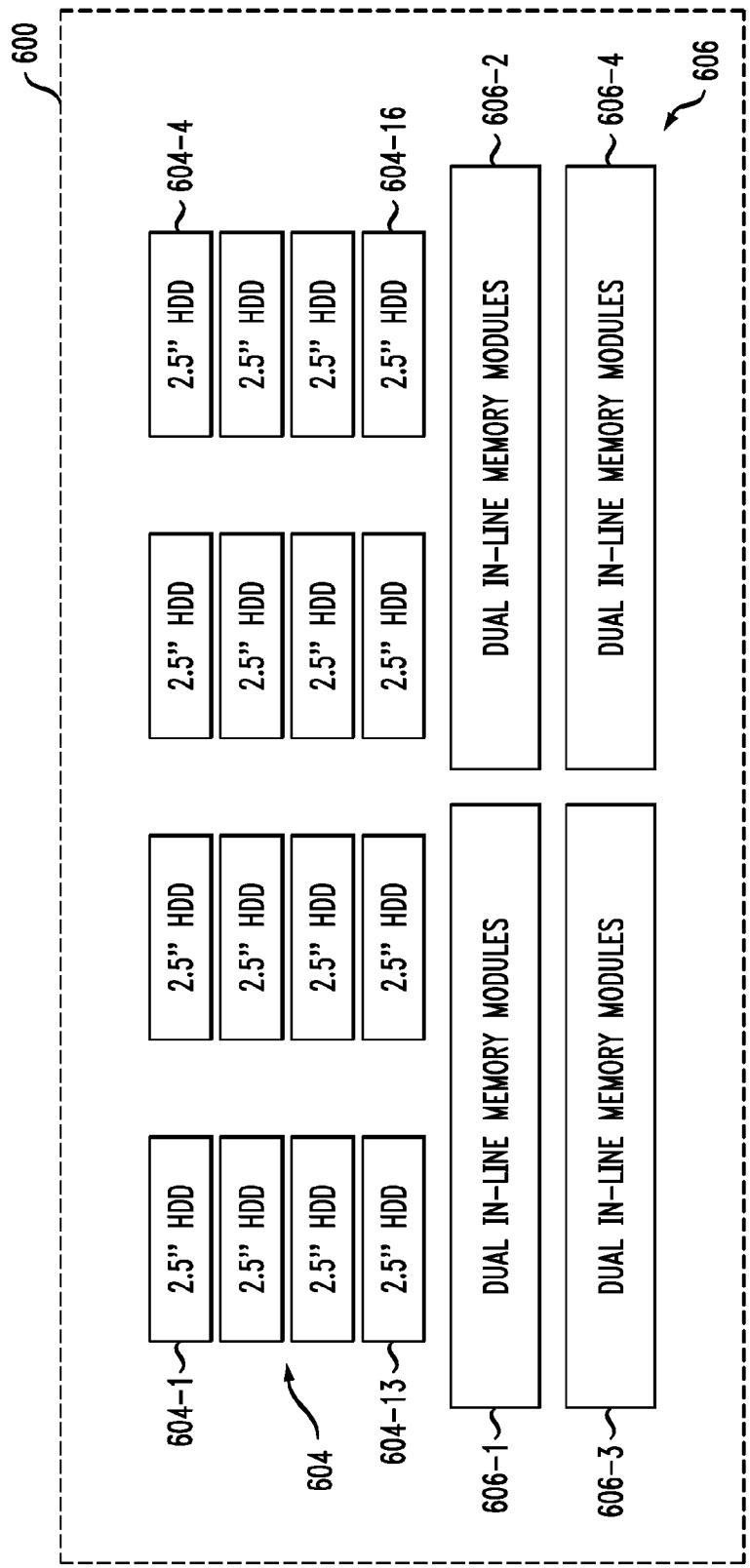
FIG. 7 is a frontal view of a portion of the FIG. 6 chassis.

Referring now to FIG. 7, a frontal view of the chassis 600 is shown. It can be seen in this view that the first row of dual in-line memory modules 606 more particularly comprises groups 606-1 and 606-2, and the second row of dual in-line memory modules 606 more particularly comprises groups 606-3 and 606-4. These groups are arranged below a set of 16 2.5" HDDs 604, more particularly denoted in the figure as HDDs 604-1 through 604-16. The HDDs are horizontally oriented with sets of four HDDs being arranged in parallel with one another in a corresponding vertical grouping, above the first and second rows of dual in-line memory modules 606.

Figure 8:
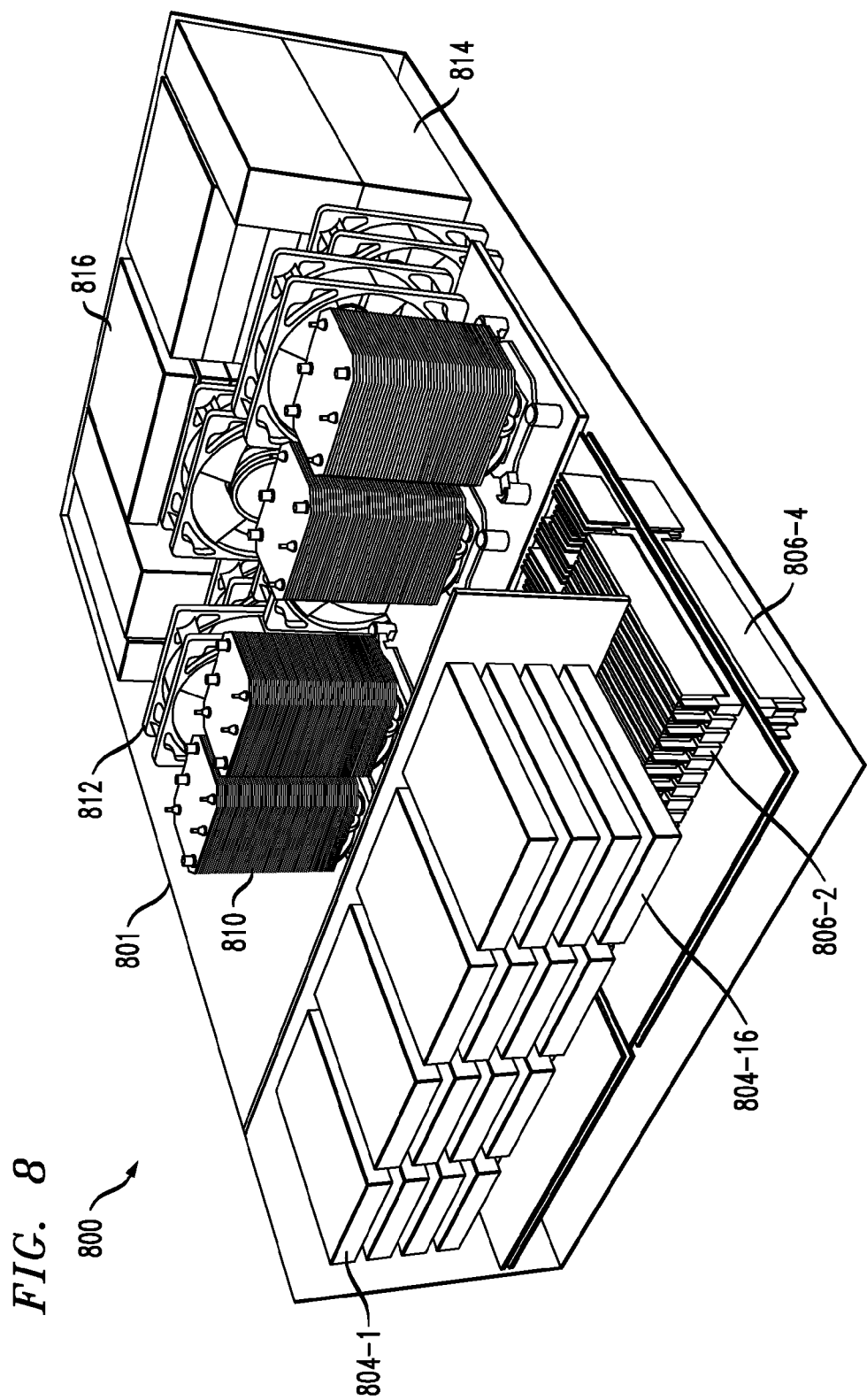
FIG. 8 is a perspective view of an electronic equipment chassis having multiple groups of dual in-line memory modules and a plurality of storage devices all configured for front-access removability in a fourth illustrative embodiment of the invention.

FIG. 8 shows an electronic equipment chassis 800 in another illustrative embodiment. Like the chassis 600, the chassis 800 comprises a housing 801 with front, middle and rear portions. The front portion of the housing 801 includes multiple groups of dual-in-line memory modules 806 and a plurality of storage devices 804 all configured for front-access removability. In addition, the groups of dual in-line memory modules 806 are arranged on respective slidable trays so as be removable from the chassis 800 through a vertical plane of the front portion of the chassis housing 801. Each of the groups comprises a plurality of dual in-line memory modules arranged in multiple slots secured to a slidable tray. The slidable tray is configured to allow the given group to be removed from the chassis 800 separately from the other groups through the vertical plane of the front portion of the chassis housing 801. Each of the slidable trays also includes one or more small heat sinks. The slidable trays correspond generally to respective ones of the memory risers described in conjunction with other embodiments.

The middle portion of the chassis housing 801 includes four larger heat sinks 810 and a set of fans 812.

The rear portion of the chassis housing 801 includes additional electrical equipment such as power supplies 814 and interface cards 816.

FIG. 9 illustrates the removal of a particular one of the groups of dual in-line memory modules 806-2 from the chassis 800. It can be seen that group 806-2 is arranged on a corresponding slidable tray 818-2. The dual in-line memory modules of the group 806-2 include individual modules 820 inserted in respective slots 822 secured to the slidable tray 818-2. As illustrated in the figure, the slidable tray 818-2 is configured to allow the given group 806-2 to be removed from the chassis 800 separately from the other groups through a vertical plane of the front portion of the housing 801 of the chassis 800. Each of the three other groups of dual in-line memory modules 806 is assumed to be similarly removable through the vertical plane of the front portion of the chassis housing.

FIG. 10 illustrates the removal of a particular one of the storage devices 804-6 from the chassis 800. Each of the 15 other storage devices 804 is assumed to be similarly removable through a vertical plane of the front portion of the chassis housing 801. The storage devices 804, like the storage devices 604 of the FIG. 6 embodiment, are implemented as respective 2.5" HDDs.

It should again be emphasized that the particular chassis configurations shown in the illustrative embodiments of FIGS. 1 through 10 are presented by way of example for purposes of illustration only, and alternative embodiments can utilize a wide variety of other chassis configurations providing front-access removability of storage devices and associated cooling modules or dual in-line memory modules. Accordingly, the particular configurations of modules and other components as shown in the figures can be varied in other embodiments. Moreover, the various assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:

1. An electronic equipment chassis comprising:
    a housing having a front portion and a rear portion;
    first and second rows of cooling modules disposed at respective upper and lower levels of the front portion; and
    a plurality of storage devices arranged in the front portion between the first and second rows of cooling modules;
    wherein the electronic equipment chassis has a rack mount configuration for mounting of the electronic equipment chassis in an electronic equipment rack;
    wherein at least a subset of the cooling modules and at least a subset of the storage devices are configured for each such cooling module and storage device to be individually removable from the chassis through a vertical plane of the front portion of the housing;
    a given one of the cooling modules of the subset of cooling modules thereby being removable from the chassis through the vertical plane of the front portion of the housing separately from one or more other ones of the cooling modules in a same one of the first and second rows as the given one of the cooling modules; and
    a given one of the storage devices of the subset of storage devices thereby being removable from the chassis through the vertical plane of the front portion of the housing separately from one or more other ones of the storage devices.

2. The chassis of claim 1 wherein the cooling modules comprise respective blower assemblies.

3. The chassis of claim 1 wherein the first row of cooling modules comprises respective blower assemblies oriented to direct air in a first lateral direction away from the storage devices and towards the rear portion of the housing.

4. The chassis of claim 1 wherein the second row of cooling modules comprises respective blower assemblies oriented to direct air in a second lateral direction away from the storage devices and towards the rear portion of the housing.

5. The chassis of claim 1 wherein the storage devices comprise respective hard disk drives that are vertically oriented and arranged in parallel with one another in the front portion of the housing.

6. The chassis of claim 1 wherein each of the first and second rows of cooling modules comprises at least four cooling modules.

7. The chassis of claim 1 wherein the chassis has a 4U rack mount configuration.

8. The chassis of claim 1 wherein the housing further comprises a middle portion between the front and rear portions, the chassis further comprising a plurality of dual in-line memory modules arranged in the middle portion.

9. The chassis of claim 1 further comprising additional electrical equipment arranged in the rear portion of the housing, said additional electrical equipment comprising one or more processors, circuit boards, interface cards and power supplies.

10. The chassis of claim 1 wherein each of said at least a subset of the cooling modules and said at least a subset of the storage devices configured so as to be removable from the chassis through the vertical plane of the front portion is configured as a hot-pluggable module.

11. The chassis of claim 1 wherein the chassis further comprises a front panel coincident with the vertical plane and wherein said at least a subset of the cooling modules and said at least a subset of the storage devices are configured so as to be removable from the chassis through at least one opening in the front panel.

12. An electronic equipment rack comprising:
    a first electronic equipment chassis mounted in the electronic equipment rack; and
    at least one additional electronic equipment chassis mounted in the electronic equipment rack;
    wherein at least one of the first electronic equipment chassis and the additional electronic equipment chassis each comprises:
    a housing having a front portion and a rear portion;
    first and second rows of cooling modules disposed at respective upper and lower levels of the front portion; and
    a plurality of storage devices arranged in the front portion between the first and second rows of cooling modules;
    wherein at least a subset of the cooling modules and at least a subset of the storage devices are configured for each such cooling module and storage device to be individually removable from the chassis through a vertical plane of the front portion of the housing;

a given one of the cooling modules of the subset of cooling modules thereby being removable from the chassis through the vertical plane of the front portion of the housing separately from one or more other ones of the cooling modules in a same one of the first and second rows as the given one of the cooling modules; and a given one of the storage devices of the subset of storage devices thereby being removable from the chassis through the vertical plane of the front portion of the housing separately from one or more other ones of the storage devices.

13. A method comprising:

configuring an electronic equipment chassis to include first and second rows of cooling modules disposed at respective upper and lower levels of a front portion of a housing of the chassis;

configuring the electronic equipment chassis to further include a plurality of storage devices arranged in the front portion of the housing between the first and second rows of cooling modules; and removing at least a subset of the cooling modules and at least a subset of the storage devices individually from the chassis through a vertical plane of the front portion of the housing;

wherein the electronic equipment chassis has a rack mount configuration for mounting of the electronic equipment chassis in an electronic equipment rack;

a given one of the cooling modules of the subset of cooling modules being removable from the chassis through the vertical plane of the front portion of the housing separately from one or more other ones of the cooling modules in a same one of the first and second rows as the given one of the cooling modules; and a given one of the storage devices of the subset of storage devices being removable from the chassis through the vertical plane of the front portion of the housing separately from one or more other ones of the storage devices.

14. The method of claim 13 further comprising mounting the electronic equipment chassis in the electronic equipment rack, and wherein said removing occurs while the electronic equipment chassis is mounted in the electronic equipment rack.

15. The method of claim 13 wherein said removing comprises removing said at least a subset of the cooling modules and said at least a subset of the storage devices from the chassis through at least one opening in a front panel coincident with the vertical plane.

16. The electronic equipment rack of claim 12 wherein the first row of cooling modules comprises respective blower assemblies oriented to direct air in a first lateral direction away from the storage devices and towards the rear portion of the housing and the second row of cooling modules comprises respective blower assemblies oriented to direct air in a second lateral direction away from the storage devices and towards the rear portion of the housing.

17. The electronic equipment rack of claim 12 wherein the storage devices comprise respective hard disk drives that are vertically oriented and arranged in parallel with one another in the front portion of the housing.

18. The electronic equipment rack of claim 12 wherein the chassis further comprises a front panel coincident with the vertical plane and wherein said at least a subset of the cooling modules and said at least a subset of the storage devices are configured so as to be removable from the chassis through at least one opening in the front panel.

19. The method of claim 13 wherein the first row of cooling modules comprises respective blower assemblies oriented to direct air in a first lateral direction away from the storage devices and towards the rear portion of the housing and the second row of cooling modules comprises respective blower assemblies oriented to direct air in a second lateral direction away from the storage devices and towards the rear portion of the housing.

20. The method of claim 13 wherein the storage devices comprise respective hard disk drives that are vertically oriented and arranged in parallel with one another in the front portion of the housing.

* * * * *